(12) United States Patent
Xu

(10) Patent No.: US 9,899,452 B2
(45) Date of Patent: Feb. 20, 2018

(54) ARRAY SUBSTRATE AND METHOD OF FABRICATING THE SAME

(71) Applicant: Shenzhen China Star Optoelectronics Technology Co. Ltd., Shenzhen, Guangdong (CN)

(72) Inventor: Hongyuan Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 116 days.

(21) Appl. No.: 14/904,489

(22) PCT Filed: Dec. 25, 2015

(86) PCT No.: PCT/CN2015/098964
§ 371 (c)(1),
(2) Date: Jan. 12, 2016

(87) PCT Pub. No.: WO2017/096649
PCT Pub. Date: Jun. 15, 2017

(65) Prior Publication Data
US 2017/0229517 A1 Aug. 10, 2017

(30) Foreign Application Priority Data

Dec. 7, 2015 (CN) .......................... 2015 1 0894818

(51) Int. Cl.
*H01L 27/28* (2006.01)
*H01L 29/786* (2006.01)

(52) U.S. Cl.
CPC .......... *H01L 27/286* (2013.01); *H01L 27/283* (2013.01); *H01L 29/7869* (2013.01)

(58) Field of Classification Search
CPC ..... H01L 27/28; H01L 27/286; H01L 27/283; H01L 29/7869; H01L 51/5221
See application file for complete search history.

(56) References Cited

U.S. PATENT DOCUMENTS

| | | | |
|---|---|---|---|
| 2011/0095272 A1* | 4/2011 | Ng | G11C 11/22 257/40 |
| 2013/0306968 A1* | 11/2013 | Chang | H01L 29/41733 257/57 |
| 2015/0192850 A1* | 7/2015 | Ide | C08G 77/388 430/281.1 |
| 2015/0212380 A1* | 7/2015 | Chen | G02F 1/136286 349/42 |

* cited by examiner

*Primary Examiner* — Phuc Dang
(74) *Attorney, Agent, or Firm* — Andrew C. Cheng

(57) ABSTRACT

The present invention proposes an array substrate and a method for fabricating the same. According to the array substrate and the method of fabricating the array substrate in the present invention, the IGZO pattern and the first electrode strip, the first channel, and the second metallic layer in the corresponding section form the first transistor of the CMOS inverter, and the OSC pattern and the second electrode strip, the second channel, and the second metallic layer in the corresponding section form the second transistor of the CMOS inverter. In this way, the CMOS inverter or the CMOS ring oscillator is fabricated based on IGZO and OSC.

13 Claims, 5 Drawing Sheets

ARRAY SUBSTRATE AND METHOD OF FABRICATING THE SAME

BACKGROUND OF THE INVENTION

1. Field of the Invention

The present invention relates to the field of display technology, and more particularly, to an array substrate and a method of fabricating the array substrate.

2. Description of the Prior Art

For designing the structure of a liquid crystal display (LCD), a plurality of complementary metal oxide semiconductor (CMOS) inverters form a CMOS ring oscillator. The CMOS ring oscillator is used for generating a clock signal in the circuit. Compared with a conventional N-channel mosfet (NMOS) inverter and a conventional P-channel mosfet (PMOS) inverter, the CMOS inverter comprises a P-channel MOS transistor and an N-channel MOS transistor connected in series. The P-channel MOS transistor is used as carrier transistor, and the N-channel MOS transistor is used as an input transistor. Also, one of the two MOS transistors is always disconnected or turned off, which is good for lowering consumed power greatly. In addition, the resistance of the CMOS inverter is relatively smaller so the processing speed is obviously enhanced.

Currently, the industry generally adopts a thin film transistor (TFT) fabricated by indium gallium zinc oxide (IGZO). This kind of TFT has a pattern of amorphous oxide semiconductor (AOS). And organic semiconductor (OSC) is an organic material made from small particles or high molecular polymer. The features of the OSC are flexibility and low production costs, so the OSC is widely used in the field of flexible displays and electronic skin. To sum up, to improve LCDs while to fabricate the CMOS inverter or the CMOS ring oscillator based on IGZO and OSC at the same time waits to be resolved by the industry.

SUMMARY OF THE INVENTION

In light of this, the present invention proposes an array substrate and a method of fabricating the array substrate for fabricating a CMOS inverter or a CMOS ring oscillator based on IGZO and OSC.

According to the present invention, a method of fabricating an array substrate, comprises: forming a first metallic layer, a plurality common electrodes arranged along a predetermined direction, and an insulting layer on a substrate in order where the first metallic layer comprises a first electrode strip and a second electrode strip arranged at intervals along a predetermined direction, arranging each of the common electrodes between the first electrode strip and the second electrode strip which is adjacent to the first electrode strip, and forming a capacitor between the common electrode and the second metallic layer and the insulating layer in the corresponding section; forming an indium gallium zinc oxide (IGZO) pattern arranged at intervals on the insulating layer along the predetermined direction, and arranging the IGZO pattern above the first electrode strip; forming a second metallic layer on the insulating layer and the IGZO pattern layer, alternately arranging a first channel and a second channel on the second metallic layer along the predetermined direction, exposing a corresponding section of the first channel where the IGZO pattern is formed, exposing a corresponding section of the second channel where the insulating layer is formed, and locating the insulating layer above the second electrode strip; forming an organic semiconductor (OSC) pattern on the corresponding section of the second channel; forming a flat passivation layer on the insulating layer, the second metallic layer, the IGZO pattern, and the OSC pattern. The first electrode strip, the first channel, and the second metallic layer and the IGZO pattern in a corresponding section form the first transistor, the second electrode strip, the second channel. The second metallic layer and the OSC pattern in a corresponding section form the second transistor. The first transistor and the second transistor are connected in series to form a complementary metal oxide semiconductor (CMOS) inverter. The first electrode strip and the second electrode strip both are gates of a thin film transistor (TFT) in the array substrate. The second metallic layer comprises a source and a drain of the TFT. The first channel and the second channel are alternately arranged between the source and the drain which is adjacent to the source along the predetermined direction. The same drain is arranged between the first channel and the second channel which is adjacent to the first channel.

Furthermore, the first electrode strip, the first channel, and the source, the drain, and the IGZO pattern in the corresponding section form the first transistor. The second electrode strip, the second channel, and the source, the drain, and the OSC pattern form the second transistor. The array substrate forms the plurality of CMOS inverters in an odd number. A first CMOS inverter is connected to a last CMOS inverter.

Furthermore, the first transistor is an N-channel MOS transistor, and the second transistor is a P-channel MOS transistor.

According to the present invention, a method of fabricating an array substrate comprises: forming a first metallic layer and an insulting layer on a substrate in order where the first metallic layer comprises a first electrode strip and a second electrode strip arranged at intervals along a predetermined direction; forming an indium gallium zinc oxide (IGZO) pattern arranged at intervals on the insulating layer along the predetermined direction, and arranging the IGZO pattern above the first electrode strip; forming a second metallic layer on the insulating layer and the IGZO pattern layer, alternately arranging a first channel and a second channel on the second metallic layer along the predetermined direction, exposing a corresponding section of the first channel where the IGZO pattern is formed, exposing a corresponding section of the second channel where the insulating layer is formed, and locating the insulating layer above the second electrode strip; forming an organic semiconductor (OSC) pattern on the corresponding section of the second channel; forming a flat passivation layer on the insulating layer, the second metallic layer, the IGZO pattern, and the OSC pattern. The first electrode strip, the first channel, and the second metallic layer and the IGZO pattern in a corresponding section form the first transistor. The second electrode strip, the second channel, and the second metallic layer and the OSC pattern in a corresponding section form the second transistor. The first transistor and the second transistor are connected in series to form a complementary metal oxide semiconductor (CMOS) inverter.

Furthermore, the first electrode strip and the second electrode strip both are gates of a thin film transistor (TFT) in the array substrate, the second metallic layer comprises a source and a drain of the TFT, the first channel and the second channel are alternately arranged between the source and the drain which is adjacent to the source along the predetermined direction, and the same drain is arranged between the first channel and the second channel which is adjacent to the first channel.

Furthermore, the first electrode strip, the first channel, and the source, the drain, and the IGZO pattern in the corresponding section form the first transistor, the second electrode strip, the second channel, and the source, the drain, and the OSC pattern form the second transistor, the array substrate forms the plurality of CMOS inverters in an odd number, and a first CMOS inverter is connected to a last CMOS inverter.

Furthermore, the first transistor is an N-channel MOS transistor, and the second transistor is a P-channel MOS transistor.

Furthermore, after the first metallic layer is formed on the substrate, the method further comprises: forming a plurality of common electrodes arranged alternatively on the substrate along the predetermined direction, arranging each of the common electrodes between the first electrode strip and the second electrode strip which is adjacent to the first electrode strip, and forming a capacitor between the common electrode and the second metallic layer and the insulating layer in the corresponding section.

According to the present invention, an array substrate comprises: a substrate; a first metallic layer and an insulting layer, formed on the substrate where the first metallic layer comprises a first electrode strip and a second electrode strip arranged at intervals along a predetermined direction; an indium gallium zinc oxide (IGZO) pattern above the first electrode strip, arranged at intervals on the insulating layer along the predetermined direction; a second metallic layer, formed on the insulating layer and the IGZO pattern layer, alternately arranging a first channel and a second channel on the second metallic layer along the predetermined direction, wherein a corresponding section of the first channel is uncovered by the IGZO pattern, a corresponding section of the second channel above the second electrode strip is uncovered by the insulating layer; an organic semiconductor (OSC) pattern, formed on the corresponding section of the second channel; a flat passivation layer, formed on the insulating layer, the second metallic layer, the IGZO pattern, and the OSC pattern. The first electrode strip, the first channel, and the second metallic layer and the IGZO pattern in a corresponding section form the first transistor. The second electrode strip, the second channel, and the second metallic layer and the OSC pattern in a corresponding section form the second transistor. The first transistor and the second transistor are connected in series to form a complementary metal oxide semiconductor (CMOS) inverter.

Furthermore, the first electrode strip and the second electrode strip both are gates of a thin film transistor (TFT) in the array substrate, the second metallic layer comprises a source and a drain of the TFT, the first channel and the second channel are alternately arranged between the source and the drain which is adjacent to the source along the predetermined direction, and the same drain is arranged between the first channel and the second channel which is adjacent to the first channel.

Furthermore, the first electrode strip, the first channel, and the source, the drain, and the IGZO pattern in the corresponding section form the first transistor, the second electrode strip, the second channel, and the source, the drain, and the OSC pattern form the second transistor, the array substrate forms the plurality of CMOS inverters in an odd number, and a first CMOS inverter is connected to a last CMOS inverter.

Furthermore, the first transistor is an N-channel MOS transistor, and the second transistor is a P-channel MOS transistor.

Furthermore, the array substrate further comprises: a plurality of common electrode, arranged alternatively on the substrate along the predetermined direction, wherein each common electrode is between the first electrode strip and the second electrode strip which is adjacent to the first electrode strip, and a capacitor is formed between the common electrode and the second metallic layer and the insulating layer in the corresponding section.

According to the array substrate and the method of fabricating the array substrate in the present invention, the IGZO pattern and the first electrode strip, the first channel, and the second metallic layer in the corresponding section form the first transistor of the CMOS inverter, and the OSC pattern and the second electrode strip, the second channel, and the second metallic layer in the corresponding section form the second transistor of the CMOS inverter. In this way, the CMOS inverter or the CMOS ring oscillator is fabricated based on IGZO and OSC.

DETAILED DESCRIPTION OF THE PREFERRED EMBODIMENTS

Embodiments of the present invention are described in detail with the technical matters, structural features, achieved objects, and effects with reference to the accompanying drawings as follows.

Figure 1:
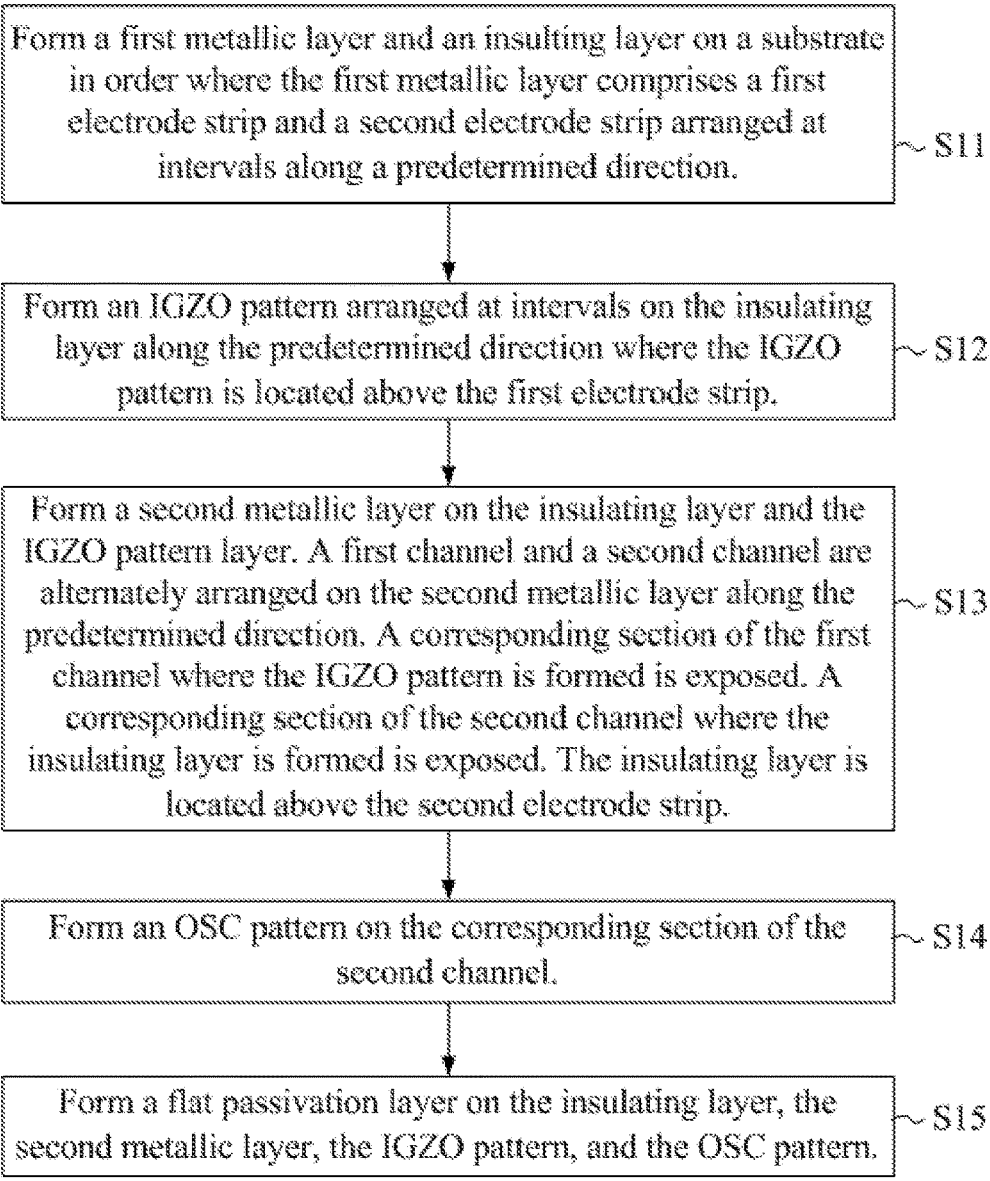
FIG. 1 is a flowchart of a method for fabricating an array substrate according a preferred embodiment of the present invention.

FIG. 1 is a flowchart of a method for fabricating an array substrate according a preferred embodiment of the present invention. With the method, a CMOS inverter or a CMOS ring oscillator are formed simultaneously when a TFT is formed. Please refer to FIG. 1 and FIG. 2. The method comprises following steps of:

Step S11: Form a first metallic layer and an insulting layer on a substrate in order where the first metallic layer comprises a first electrode strip and a second electrode strip arranged at intervals along a predetermined direction.

Figure 2:
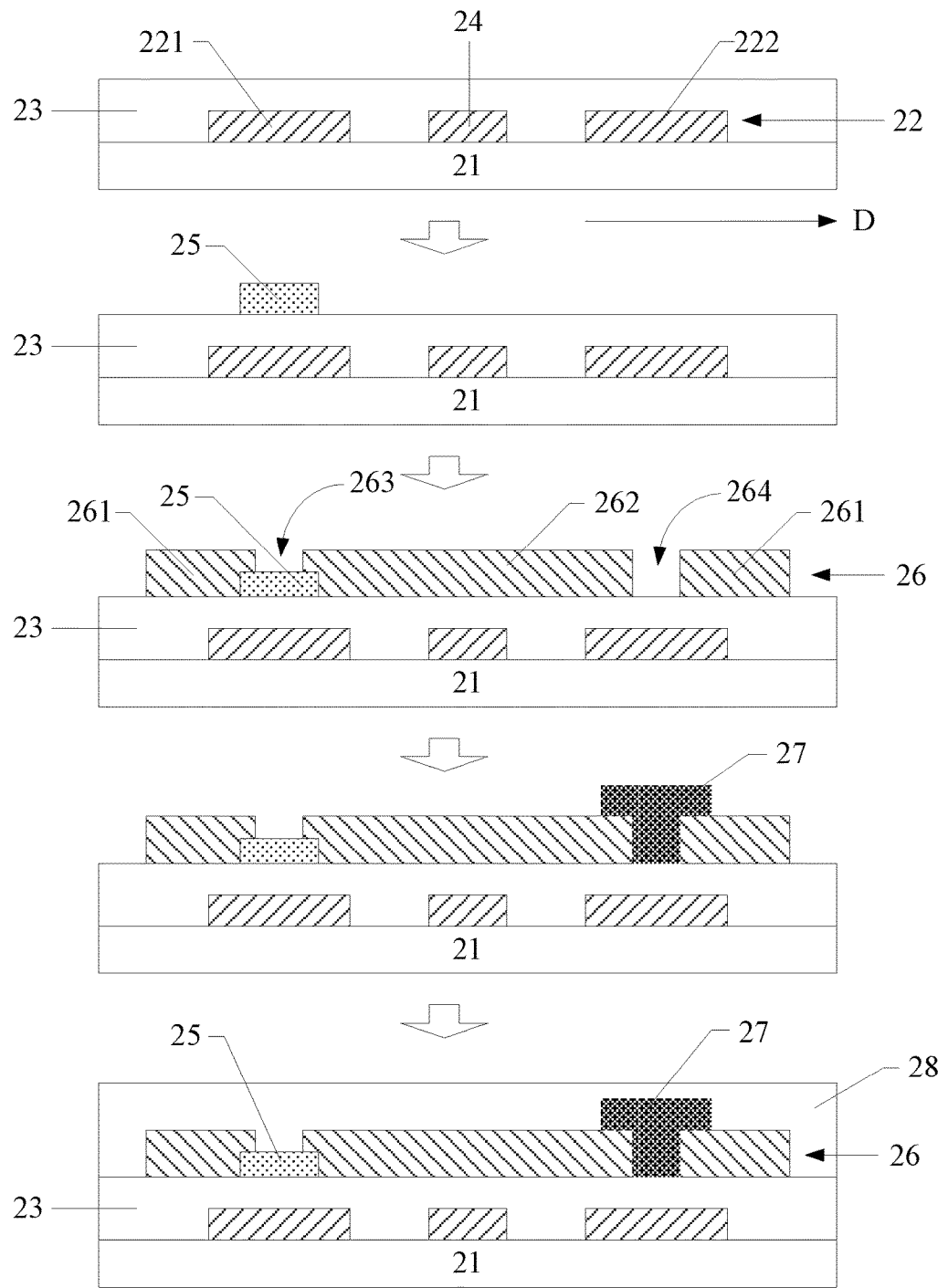
FIG. 2 shows an array substrate formed by using the method illustrated in FIG. 1.

Please refer to FIG. 2. A substrate 21 is used for forming the aforementioned array substrate. The substrate 21 may be a glass substrate, a transparent plastic substrate, or a flexible substrate.

A first metallic layer 22 is formed on the substrate 21 in a first mask process and a first photolithography process, and a gate of the TFT with a predetermined pattern is formed in this embodiment. The gate of the TFT comprises a first electrode strip 221 and a second electrode strip 222 arranged alternatively along a predetermined direction D as FIG. 2 shows with an arrow (only one first electrode strip 221 and only one second electrode strip 222 are shown in the figures). The predetermined direction D is a horizontal direction, which is vertical to the extending direction of each of the gates.

The first metallic layer comprises a first electrode strip and a second electrode strip arranged at intervals along a predetermined direction.

Of course, the first metallic layer 22 is formed by using chemical vapor deposition (CVD), vacuum evaporation deposition, plasma chemical vapor deposition (PCVD), sputtering, and low-pressure chemical vapor deposition (LP-CVD).

A source of the TFT and a drain of the TFT are compulsively formed subsequently. Further, an insulating layer 23 (i.e., gate insulation layer, GI) is formed on the first metallic layer 22 and on the substrate 21 where the first metallic layer 22 is not formed.

After the first metallic layer 22 is formed, common electrodes 24 are further arranged alternatively on the substrate 21 along the predetermined direction D (only one common electrode 24 is shown in figures). Each of the common electrodes 24 is arranged between the first electrode strip 221 and the second electrode strip 222 which is adjacent to the first electrode strip 221. It is also possible that the first metallic layer 22 and the common electrodes 24 are formed in the first mask process and the first photolithography process. That is, the first metallic layer 22 and the common electrodes 24 are formed in the same mask process and the same photolithography process.

Step S12: Form an IGZO pattern arranged at intervals on the insulating layer along the predetermined direction where the IGZO pattern is located above the first electrode strip.

An IGZO layer 25 is formed on the insulating layer 23 with a predetermined pattern in a second mask process and a second photolithography process. The second photolithography process etches a whole sheet of a semiconducting pattern layer 24 formed on the insulating layer 23 with an etchant for forming the IGZO layer 25. The etchant may comprise, but is not confined to, ortho-phosphoric acid, nitric acid, acetate acid, and deionized water. In addition, it is also possible to use dry etching in other embodiments.

Step S13: Form a second metallic layer on the insulating layer and the IGZO pattern layer. A first channel and a second channel are alternately arranged on the second metallic layer along the predetermined direction. A corresponding section of the first channel where the IGZO pattern is formed is exposed. A corresponding section of the second channel where the insulating layer is formed is exposed. The insulating layer is located above the second electrode strip.

A second metallic layer 26 with a predetermined pattern is formed on the insulating layer 23 in a third mask process and a third photolithography process in this embodiment. In other words, a source/drain electrode layer of the TFT is formed. The second metallic layer 26 comprises a source 261 and a drain 262. A first channel 263 and a second channel 264 are formed between the source 261 and the drain 262 which is adjacent to the source 261 along the predetermined direction D. The same drain 262 is arranged between the first channel 263 and the second channel 264 which is adjacent to the first channel 263. The first channel 263 is arranged above the first electrode strip 221, and the second channel 264 is arranged above the second electrode strip 222.

Step S14: Form an OSC pattern on the corresponding section of the second channel.

An OSC layer 27 is formed on a corresponding section of the second channel in a fourth mask process and a fourth photolithography process in this embodiment. As FIG. 2 shows, the height of the OSC layer 27 is larger than the height of the second metallic layer 26. Also, the difference of the height of the OSC layer 27 and the height of the second metallic layer 26 covers the source 261 and the drain 262.

Step S15: Form a flat passivation layer on the insulating layer, the second metallic layer, the IGZO pattern, and the OSC pattern.

A flat passivation layer 28 is formed on the insulating layer 23, the second metallic layer 26, the IGZO layer 25, and the OSC layer 27 by adopting any arbitrary combinations of CVD, coating, atomic layer epitaxy, sputtering, and evaporation deposition. The flat passivation layer 28 is used for protecting the aforementioned components on the array substrate from being damaged because of external environmental factors. Besides, the flat passivation layer 28 and the insulating layer 23 are fabricated from the same materials or different materials.

Figure 3:
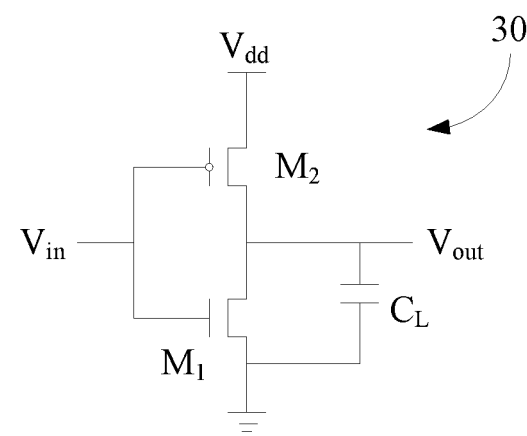
FIG. 3 is a circuit diagram of a CMOS inverter according to a preferred embodiment of the present invention.

FIG. 2 as well as FIG. 3 show that the first electrode strip 221, the first channel 263, and the source 261, the drain 262, and the IGZO layer 25 in the corresponding section form the first transistor $M_1$ and that the second electrode strip 222, the second channel 264, and the source 261, the drain 262, and the OSC layer 27 in the corresponding section form the second transistor $M_2$. The first transistor $M_1$ is an N-channel MOS transistor, and the second transistor $M_2$ is a P-channel MOS transistor. Also, the first transistor $M_1$ and the second transistor $M_2$ are connected in series to form a CMOS inverter 30 as shown in FIG. 3. Besides, the common electrodes 24 and the drain 262 and the insulating layer 23 in the corresponding section form a capacitor $C_L$.

The first electrode strip 221 and the second electrode strip 222 are the gate of the first transistor $M_1$ and the gate of the second transistor $M_2$, respectively. The two gates are connected to the input voltage $V_{in}$ of the array substrate. The two adjacent sources 261 are the source of the first transistor $M_1$ and the source of the second transistor $M_2$, respectively. The source of the first transistor $M_1$ is connected to the ground. The source of the second transistor $M_2$ is connected to a supply voltage $V_{dd}$ of the array substrate (also called as VDD). The two adjacent drains 262 are the drain of the first transistor $M_1$ and the drain of the second transistor $M_2$, respectively. The two drains are used for outputting the output voltage $V_{out}$ of the array substrate.

While the input voltage $V_{in}$ is at low voltage level, the output voltage $V_{out}$ is at high voltage level. While the input voltage $V_{in}$ is at high voltage level, the output voltage $V_{out}$ is at low voltage level.

Figure 4:
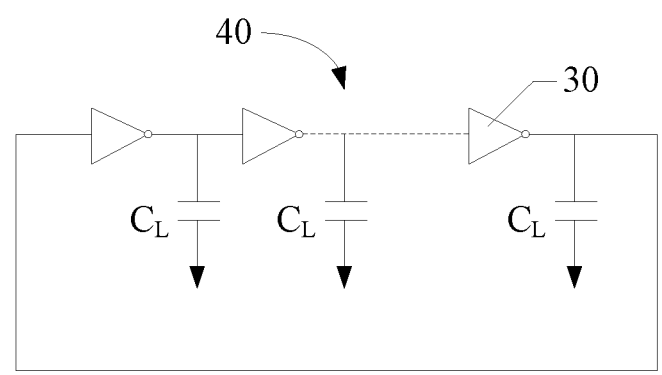
FIG. 4 is a circuit diagram of a CMOS ring oscillator formed by the CMOS inverter as shown in FIG. 3.
Figure 5:
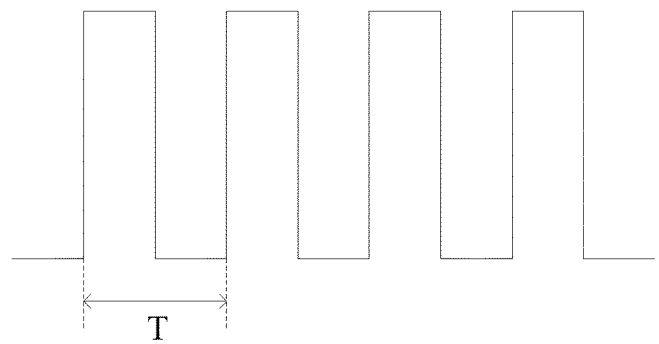
FIG. 5 shows a waveform of a timing signal outputted by the CMOS ring oscillator of FIG. 4.

Please refer to FIG. 4. The plurality of CMOS inverters 30 in an odd numbered are formed. The first CMOS inverter 30 and the last CMOS inverter 30 are connected, which means that the input terminal of a CMOS inverter 30 is connected to the output terminal of the next CMOS inverter 30. In other words, the output voltage $V_{out}$ of a CMOS inverter 30 is used as the input voltage $V_{in}$ of the next CMOS inverter 30. The plurality of CMOS inverters 300 in an odd number are connected and form a CMOS ring oscillator 40 in the array substrate. The CMOS ring oscillator 40 converts the supply voltage $V_{dd}$ of the array substrate as a clock signal through. Please refer to FIG. 5. The clock signal has a cycle T, and the cycle T matches a relationship as follows:

$$T = \frac{n \cdot V_{dd} \cdot C_L}{(V_{dd} - V_t)^2} \left( \frac{1}{\beta_n} + \frac{1}{\beta_p} \right)$$

Note that n is the number of the CMOS inverter 30, $C_L$ is the size of the capacity, $V_t$ is a threshold voltage of the first transistor $M_1$ and the second transistor $M_2$, $\beta_n$ and $\beta_p$ are relevant parameters of the IGZO layer 25 and the OSC layer 27, respectively. The relevant parameters are relative to parameters such as electron mobility, ratio of width to length, etc. It is understood that the operating principle of the CMOS inverter 30 in this embodiment is identical to the CMOS inverter in the conventional technology. Also, the relevant parameters in the relationship can refer to the conventional technology, so the present invention does not detail them.

It is understood that the CMOS inverter 30 or the CMOS ring oscillator is fabricated using IGZO and OSC as materials based on IGZO and OSC, so the array substrate has merits of low quiescent power, strong anti-interference, and high power utilization.

The first, second, third, and fourth mask processes use different masks. These mask processes can refer to the conventional technology, so the present invention does not go into detail.

Figure 6:
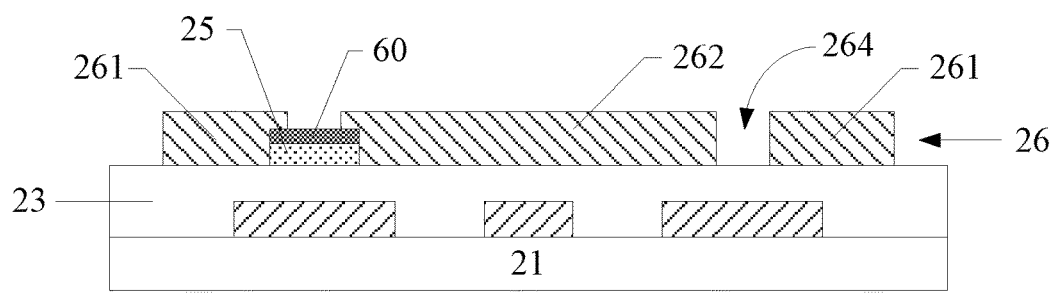
FIG. 6 shows a protection layer formed on a IGZO layer.

Please refer to FIG. 6. A protective layer 60 is formed on the IGZO layer 25 as shown in FIG. 2. The protective layer 60 is also called as "water-oxygen barrier layer" or "etch stop layer (ESL)." The protective layer 60 is used for ensuring the electronic property of the IGZO channel. The protective layer 60 of the corresponding section of the first channel 263 is exposed instead of the IGZO layer 25.

An array substrate fabricated using the above-mentioned method is further proposed by this embodiment of the present invention. The array substrate looks like the structure shown in FIG. 2. The method of fabricating other components used in the array substrate can refer to the conventional technology.

Figure 7:
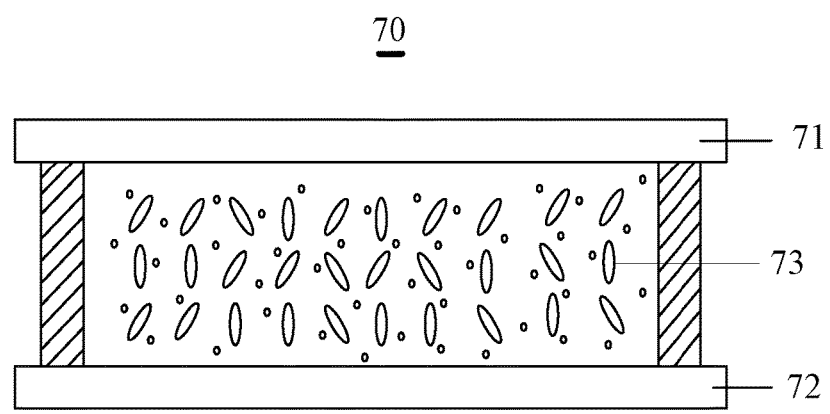
FIG. 7 is a cross-sectional view of an LCD panel according a preferred embodiment of the present invention.

An LCD panel 70 as shown in FIG. 7 is further proposed in this embodiment of the present invention. The LCD panel 70 comprises an array substrate 71, a color film substrate 72, and a liquid crystal layer 73. The array substrate 71 and the color film substrate 72 face each other with a certain distance. The liquid crystal layer 73 is sandwiched between the array substrate 71 and the color film substrate 72. The array substrate 71 is fabricated using the aforementioned method.

Figure 8:
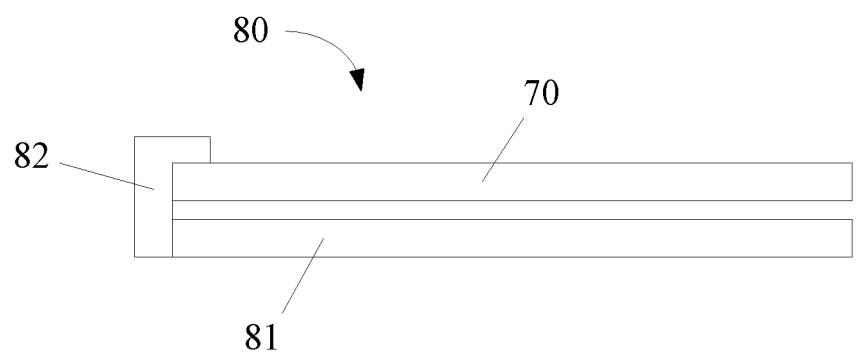
FIG. 8 is a cross-sectional view of an LCD device according a preferred embodiment of the present invention.

An LCD 80 as shown in FIG. 8 is further proposed in this embodiment of the present invention. The LCD 80 comprises the LCD panel 70 and other components such as a backlight module 81 and a front rail 82. As for the other components used in the LCD 80, the conventional technology has detailed them, so the present invention does not go into detail.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A method of fabricating an array substrate, comprising:
forming a first metallic layer, a plurality common electrodes arranged along a predetermined direction, and an insulting layer on a substrate in order where the first metallic layer comprises a first electrode strip and a second electrode strip arranged at intervals along a predetermined direction, arranging each of the common electrodes between the first electrode strip and the second electrode strip which is adjacent to the first electrode strip;
forming an indium gallium zinc oxide (IGZO) pattern arranged at intervals on the insulating layer along the predetermined direction, and arranging the IGZO pattern above the first electrode strip;
forming a second metallic layer on the insulating layer and the IGZO pattern layer, alternately arranging a first channel and a second channel on the second metallic layer along the predetermined direction, exposing a corresponding section of the first channel where the IGZO pattern is formed, exposing a corresponding section of the second channel where the insulating layer is formed, and locating the insulating layer above the second electrode strip;
forming an organic semiconductor (OSC) pattern on the corresponding section of the second channel;
forming a flat passivation layer on the insulating layer, the second metallic layer, the IGZO pattern, and the OSC pattern;
wherein the first electrode strip, the first channel, and the second metallic layer and the IGZO pattern in a corresponding section form a first transistor, the second electrode strip, the second channel, and the second metallic layer and the OSC pattern in a corresponding section form a second transistor, and the first transistor and the second transistor are connected in series to form a complementary metal oxide semiconductor (CMOS) inverter, and wherein the first electrode strip and the second electrode strip both are gates of a thin film transistor (TFT) in the array substrate, the second metallic layer comprises a source and a drain of the TFT, the first channel and the second channel are alternately arranged between the source and the drain which is adjacent to the source along the predetermined direction, and the same drain is arranged between the first channel and the second channel which is adjacent to the first channel.

2. The method of claim 1, wherein the first electrode strip, the first channel, and the source, the drain, and the IGZO pattern in the corresponding section form the first transistor, the second electrode strip, the second channel, and the source, the drain, and the OSC pattern form the second transistor, the array substrate forms the plurality of CMOS inverters in an odd number, and a first CMOS inverter is connected to a last CMOS inverter.

3. The method of claim 2, wherein the first transistor is an N-channel MOS transistor, and the second transistor is a P-channel MOS transistor.

4. A method of fabricating an array substrate, comprising:
forming a first metallic layer and an insulting layer on a substrate in order where the first metallic layer comprises a first electrode strip and a second electrode strip arranged at intervals along a predetermined direction;
forming an indium gallium zinc oxide (IGZO) pattern arranged at intervals on the insulating layer along the predetermined direction, and arranging the IGZO pattern above the first electrode strip;
forming a second metallic layer on the insulating layer and the IGZO pattern layer, alternately arranging a first channel and a second channel on the second metallic layer along the predetermined direction, exposing a corresponding section of the first channel where the IGZO pattern is formed, exposing a corresponding section of the second channel where the insulating layer is formed, and locating the insulating layer above the second electrode strip;

forming an organic semiconductor (OSC) pattern on the corresponding section of the second channel;

forming a flat passivation layer on the insulating layer, the second metallic layer, the IGZO pattern, and the OSC pattern;

wherein the first electrode strip, the first channel, and the second metallic layer and the IGZO pattern in a corresponding section form a first transistor, the second electrode strip, the second channel, and the second metallic layer and the OSC pattern in a corresponding section form a second transistor, and the first transistor and the second transistor are connected in series to form a complementary metal oxide semiconductor (CMOS) inverter.

5. The method of claim 4, wherein the first electrode strip and the second electrode strip both are gates of a thin film transistor (TFT) in the array substrate, the second metallic layer comprises a source and a drain of the TFT, the first channel and the second channel are alternately arranged between the source and the drain which is adjacent to the source along the predetermined direction, and the same drain is arranged between the first channel and the second channel which is adjacent to the first channel.

6. The method of claim 5, wherein the first electrode strip, the first channel, and the source, the drain, and the IGZO pattern in the corresponding section form the first transistor, the second electrode strip, the second channel, and the source, the drain, and the OSC pattern form the second transistor, the array substrate forms the plurality of CMOS inverters in an odd number, and a first CMOS inverter is connected to a last CMOS inverter.

7. The method of claim 6, wherein the first transistor is an N-channel MOS transistor, and the second transistor is a P-channel MOS transistor.

8. The method of claim 4, wherein after the first metallic layer is formed on the substrate, the method further comprises:

forming a plurality of common electrodes arranged alternatively on the substrate along the predetermined direction, arranging each of the common electrodes between the first electrode strip and the second electrode strip which is adjacent to the first electrode strip, and forming a capacitor between the common electrode and the second metallic layer and the insulating layer in the corresponding section.

9. An array substrate, comprising:
a substrate;
a first metallic layer and an insulting layer, formed on the substrate where the first metallic layer comprises a first electrode strip and a second electrode strip arranged at intervals along a predetermined direction;
an indium gallium zinc oxide (IGZO) pattern above the first electrode strip, arranged at intervals on the insulating layer along the predetermined direction;
a second metallic layer, formed on the insulating layer and the IGZO pattern layer, alternately arranging a first channel and a second channel on the second metallic layer along the predetermined direction, wherein a corresponding section of the first channel is uncovered by the IGZO pattern, a corresponding section of the second channel above the second electrode strip is uncovered by the insulating layer;
an organic semiconductor (OSC) pattern, formed on the corresponding section of the second channel;
a flat passivation layer, formed on the insulating layer, the second metallic layer, the IGZO pattern, and the OSC pattern;
wherein the first electrode strip, the first channel, and the second metallic layer and the IGZO pattern in a corresponding section form a first transistor, the second electrode strip, the second channel, and the second metallic layer and the OSC pattern in a corresponding section form a second transistor, and the first transistor and the second transistor are connected in series to form a complementary metal oxide semiconductor (CMOS) inverter.

10. The array substrate of claim 9, wherein the first electrode strip and the second electrode strip both are gates of a thin film transistor (TFT) in the array substrate, the second metallic layer comprises a source and a drain of the TFT, the first channel and the second channel are alternately arranged between the source and the drain which is adjacent to the source along the predetermined direction, and the same drain is arranged between the first channel and the second channel which is adjacent to the first channel.

11. The array substrate of claim 10, wherein the first electrode strip, the first channel, and the source, the drain, and the IGZO pattern in the corresponding section form the first transistor, the second electrode strip, the second channel, and the source, the drain, and the OSC pattern form the second transistor, the array substrate forms the plurality of CMOS inverters in an odd number, and a first CMOS inverter is connected to a last CMOS inverter.

12. The array substrate of claim 11, wherein the first transistor is an N-channel MOS transistor, and the second transistor is a P-channel MOS transistor.

13. The array substrate of claim 9 further comprising:
a plurality of common electrode, arranged alternatively on the substrate along the predetermined direction, wherein each common electrode is between the first electrode strip and the second electrode strip which is adjacent to the first electrode strip, and a capacitor is formed between the common electrode and the second metallic layer and the insulating layer in the corresponding section.

* * * * *